(12) United States Patent
Solgun et al.

(10) Patent No.: US 11,538,854 B2
(45) Date of Patent: Dec. 27, 2022

(54) COUPLED-LINE BUS TO SUPPRESS CLASSICAL CROSSTALK FOR SUPERCONDUCTING QUBITS

(71) Applicant: INTERNATIONAL BUSINESS MACHINES CORPORATION, Armonk, NY (US)

(72) Inventors: Firat Solgun, Ossining, NY (US); Dongbing Shao, Briarcliff Manor, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 298 days.

(21) Appl. No.: 16/833,479

(22) Filed: Mar. 27, 2020

(65) Prior Publication Data
US 2021/0305315 A1   Sep. 30, 2021

(51) Int. Cl.
  *H01L 27/18* (2006.01)
  *H01P 3/02* (2006.01)
  *G06N 10/40* (2022.01)
  *G06N 10/20* (2022.01)

(52) U.S. Cl.
  CPC ............ *H01L 27/18* (2013.01); *G06N 10/20* (2022.01); *G06N 10/40* (2022.01); *H01P 3/026* (2013.01)

(58) Field of Classification Search
  None
  See application file for complete search history.

(56) References Cited

U.S. PATENT DOCUMENTS

| 3,502,342 | A | 3/1970 | Ben Artsi | |
| 9,858,531 | B1 | 1/2018 | Monroe et al. | |
| 9,996,801 | B2 | 6/2018 | Shim et al. | |
| 10,235,634 | B1 | 3/2019 | Chen et al. | |
| 2019/0044044 | A1 | 2/2019 | Lampert et al. | |
| 2019/0165242 | A1* | 5/2019 | Brink | H01P 7/082 |
| 2020/0176158 | A1* | 6/2020 | Strong | H01P 5/185 |

FOREIGN PATENT DOCUMENTS

WO   2017/078735 A1   5/2017

OTHER PUBLICATIONS

Mundada, P. et al., "Suppression of Qubit Crosstalk in a Tunable Coupling Superconducting Circuit" arXiv:1810.04182v2 [quant-ph] (2019); 11 pgs.
Norte, A. D., "Even and Odd Mode Signal Propagation for Coplanar Coupled Microstriplines"; Research Gate (2015); 5 pgs.

* cited by examiner

*Primary Examiner* — Jay C Chang
(74) *Attorney, Agent, or Firm* — Intelletek Law Group, PLLC; Gabriel Daniel, Esq.

(57) ABSTRACT

A system includes a first quantum circuit plane that includes a first qubit, a second qubit and a third qubit. A coupled-line bus is coupled between the first qubit and the second qubit. A second circuit plane is connected to the first quantum circuit plane, comprising a control line coupled to the third qubit. The control line and the coupled-line bus are on different planes and crossing over each other, and configured to mitigate cross-talk caused by the crossing during signal transmission.

22 Claims, 4 Drawing Sheets

COUPLED-LINE BUS TO SUPPRESS CLASSICAL CROSSTALK FOR SUPERCONDUCTING QUBITS

STATEMENT REGARDING FEDERALLY SPONSORED RESEARCH OR DEVELOPMENT

This application has been written with Government support under Contract No.: W911NF-16-1-0114-FE awarded by Intelligence Advanced Research Projects Activity (IARPA). The Government has certain rights in this application.

BACKGROUND

Technical Field

The present disclosure generally relates to superconducting devices, and more particularly, qubit control.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

SUMMARY

According to various embodiments, a system and quantum circuit structure are provided for reducing cross-talk between circuit elements that are on different planes. A first quantum circuit plane includes a first qubit, a second qubit, and a coupled-line bus coupled between a first qubit and a second qubit. There is a third qubit. A second circuit plane, sometimes referred to herein as an interposer chip, is connected to the first quantum circuit plane and includes a control line that is coupled to the third qubit. The control line and the coupled-line bus are on different planes and crossing over each other and configured to mitigate cross talk caused by the crossing during signal transmission.

In one embodiment, the coupled-line bus is configured to transmit differential mode signals between the first and second qubits of the first quantum circuit plane.

In one embodiment, the first quantum circuit plane and the second circuit plane are located on separate chips of a flip chip and connected together via bump bonds.

In one embodiment, the control line is a feed line that is configured to transmit a signal to drive the third qubit.

In one embodiment, the control line is a resonator that is configured to read a signal from the third qubit.

In one embodiment, the control line is orthogonal to the coupled-line bus at the crossing to suppress an inductive coupling between the control line and the coupled-line bus.

In one embodiment, the coupled-line bus is a dual strip coplanar waveguide (CPW) transmission-line resonator.

In one embodiment, the first qubit and the second qubit are coupled to the coupled-line bus differentially and configured to excite only an odd mode of the coupled-line bus.

In one embodiment, a wavelength of a qubit excitation in the control line is longer than a width and a gap of the coupled-line bus.

In one embodiment, a suppression ratio of a crosstalk between the coupled-line bus and the control line depends on a gap between lines of the coupled-line bus.

According to one embodiment, a method of reducing crosstalk between different circuit planes of a quantum circuit, such as a qubit chip and an interposer chip, is provided. A coupled-line bus is provided between a first qubit and a second qubit of a first quantum circuit plane. A control line is provided on a second circuit plane. The control line connects to a third qubit. The first circuit plane can be on a first quantum circuit plane, the second circuit plane can be on a second circuit plane, and the first quantum circuit plane is bonded to the second circuit plane such that the control line and the coupled-line bus are on different planes and crossing over each other and mitigate cross talk caused by the crossing during signal transmission.

In one embodiment, differential mode signals are transmitted between the first and second qubits of the first quantum circuit plane.

In one embodiment, the first quantum circuit plane and the second circuit plane are on different chips, and the chips are coupled (e.g., bonded or connected) together via bump bonds.

In one embodiment, the control line is a feed line and the third qubit is driven through the feed line.

In one embodiment, a common mode signal is generated on the coupled-line bus to electrically mitigate a cross talk from the control line to the coupled-line bus.

In one embodiment, an inductive coupling between the control line and the coupled-line bus is suppressed by arranging the control line to be orthogonal to the coupled-line bus.

In one embodiment, the first qubit and the second qubit are coupled to the coupled-line bus differentially to excite only an odd mode of the coupled-line bus.

By virtue of the features discussed herein, classical crosstalk between a first quantum circuit plane and a second circuit plane, such as a qubit chip and an interposer chip in a flip chip geometry, is substantially reduced. These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
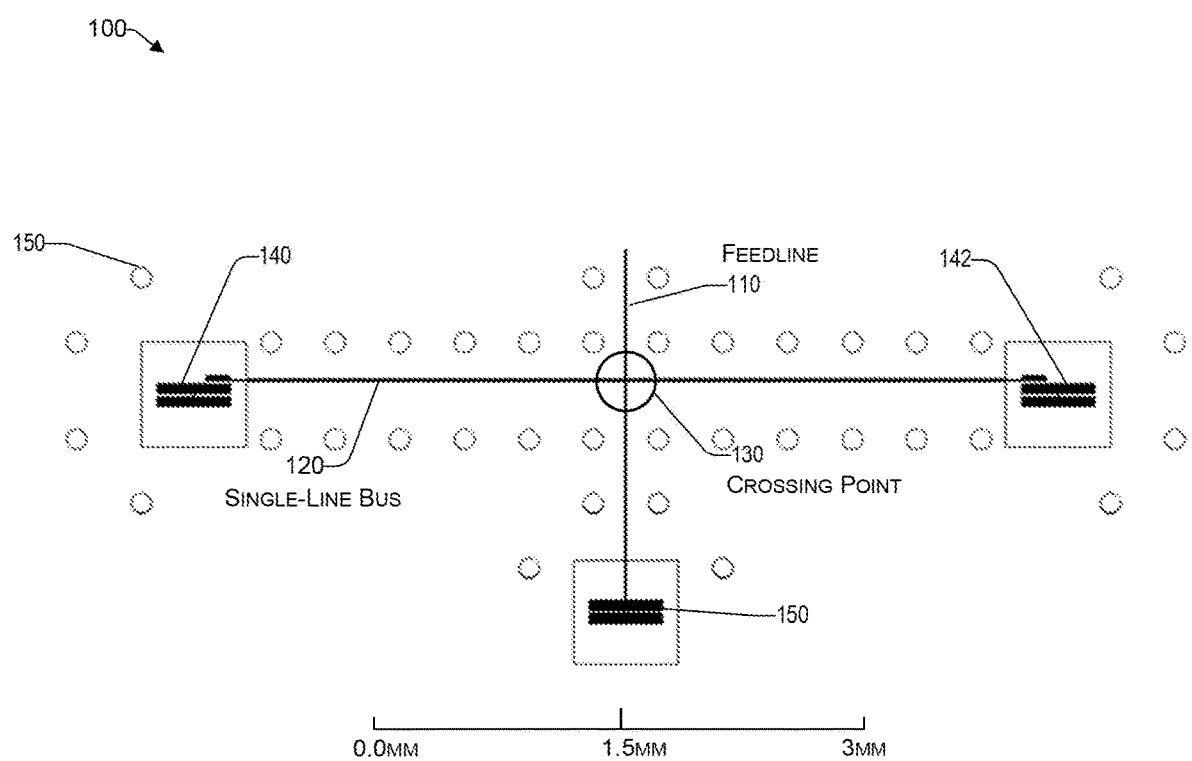
FIG. 1 illustrates a typical superconducting flip-chip architecture, where qubits are coupled to each other via buses.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, to efficient qubit control that suppresses classical crosstalk. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit has decohered to the ground or excited state. The microwave signal carrying the quantum information about the qubit state is usually weak (e.g., on the order of a few microwave photons). To measure this weak signal, low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The ability to include more qubits is salient to being able to realize the potential of quantum computers. Applicants have recognized that to increase the computational power and reliability of a quantum computer, improvements can be made along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

As the number of qubits increases, the cross-talk between its wires becomes more prominent. Classical crosstalk is a phenomenon by which a signal transmitted on one circuit or channel of a transmission system creates an undesired effect in another circuit or channel. Crosstalk is usually caused by undesired capacitive, inductive, or conductive coupling from one circuit or channel to another. In the context of qubit architectures, crosstalk may occur when one a qubit is driven through its control line and unwanted signal is leaked to other qubits via spurious microwave coupling. Reference now is made in detail to the examples illustrated in the accompanying drawings and discussed below.

Example Architectures

FIG. 1 illustrates a typical superconducting flip-chip architecture 100, where qubits are coupled to each other via buses. Architecture 100 includes first, second, and third qubits 140, 142, and 150 that are on a first qubit circuit plane. There is a single-line bus 120 between the first and second qubits 140, 142. For example, the first and second qubits 140, 142 are coupled via a single-line coplanar waveguide (CPW) transmission-line resonator bus 120 on the first circuit plane. Other than bump bonded flip chips, the circuit planes can be on the same substrate, either on the (e.g., front/back) surfaces or buried, and connected by vias (e.g., either through silicon vias (TSVs) or regular vias). The coupling of the circuit planes can occur through a conductive connection (e.g., bumps, TSVs, or vias) or through electromagnetic coupling (e.g., capacitive or inductive).

The third qubit 150 is driven through its control line 110, which is on a second circuit plane (e.g., interposer chip). In one embodiment, the interposer chip includes the control and/or readout resonators/lines for one or more qubits. The single-line bus 120 between the first and second qubits 140, 142 of the first circuit plane and the control line 110 of the third qubit 150 intersect at the crossing point 130, represented by a relatively large circle. It is noted that the smaller circles (e.g., 150) represent, by way of example only and not by way of limitation, bump bonds that may be used in flip-chip architectures, sometimes referred to as controlled collapse chip connection (C4). More generally, the small circles represent possible connection points between the first circuit plane and the second circuit plane. In the case of circuit planes on the same substrate, for example, the small circles represent TSVs or vias. It is at the intersection point 130 where crosstalk is manifest.

Thus, control lines (e.g., 110) of the second circuit plane (e.g., interposer chip) may cross the single-line buses (e.g., 120) between qubits in the first plane. Classical crosstalk is generated due to unwanted microwave coupling at the crossing points between the control lines and buses. In various scenarios, crossings can be arranged to be orthogonal to suppress the inductive coupling between the control lines and the bus lines. However, capacitive coupling will remain finite and continues to be a source of classical crosstalk.

Accordingly, in one aspect, what is provided herein is a coupled-line bus architecture that reduces the classical crosstalk between wires of different circuit planes, such as those in flip-chip architectures, by several orders of magnitude.

Figure 2:
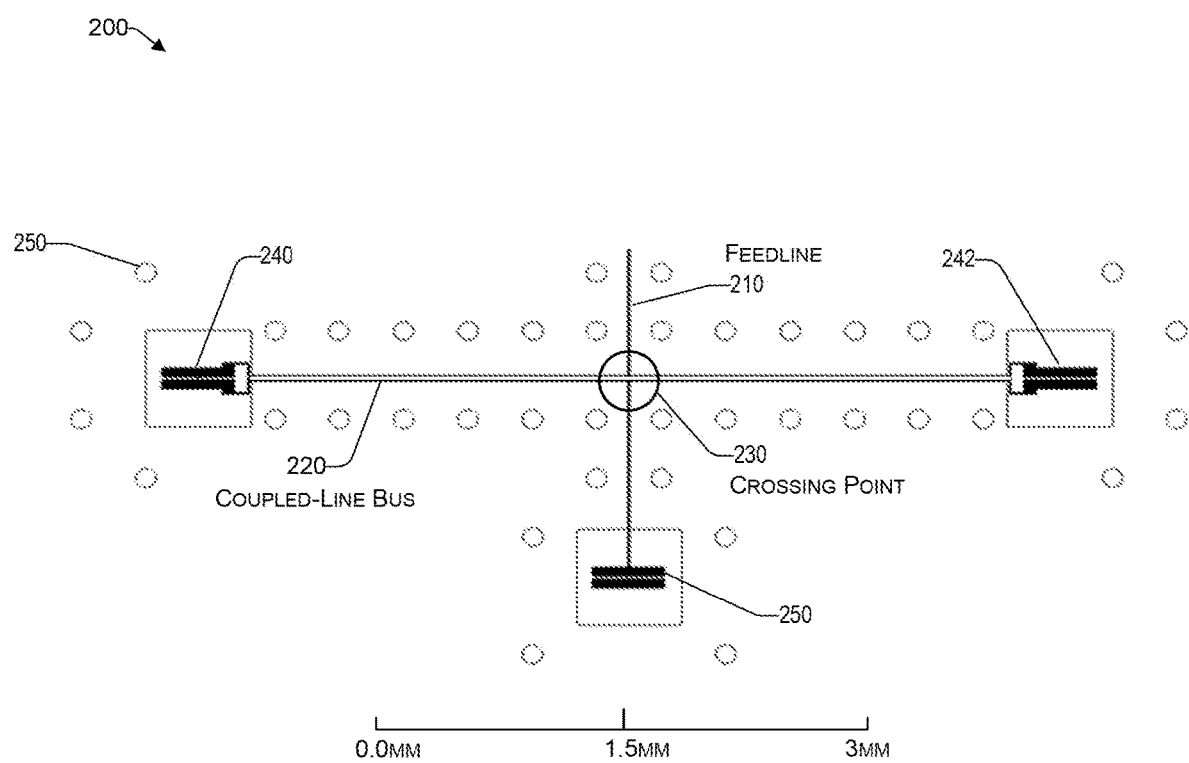
FIG. 2 illustrates a superconducting qubit architecture, consistent with an illustrative embodiment.

FIG. 2 is a superconducting qubit architecture, 200 consistent with an illustrative embodiment. Architecture 200 includes, by way of example only and not by way of limitation, first and second qubits 240 and 242 that are on a first plane, and a third qubit 250. There is a coupled line bus 220 between the first and second qubits 240, 242. Accordingly, in contrast to known architectures that use a single-line bus between qubits, in the architecture of FIG. 2 the first and second qubits 240, 242 are coupled by a coupled-line bus 220. In one embodiment, the coupled line bus 220 is implemented as a dual strip coplanar waveguide (CPW) transmission-line resonator coupled line bus 220 on a first circuit plane (e.g., chip).

In various embodiments, the coupled-line bus 220 provides odd mode, even mode, or both types of signal propagation. Even and odd modes are the two main modes of propagation of the signal through a coupled transmission line pair. In odd mode impedance is defined as impedance of a single transmission line when the two lines in a pair are driven differentially (with signals of the same amplitude and opposite polarity). In even mode impedance is defined as impedance of a single transmission line when the two lines in a pair are driven with a common mode signal (i.e., having the same amplitude and the same polarity).

These two modes of propagation can affect the signal integrity properties of these two lines. The impact of even-mode and odd-mode signal propagation on the signal integrity properties of two coupled lines may lead to increased or decreased values of the intended isolated characteristic impedance. For example, when two transmission lines are coupled to each other, the intended characteristic impedances of the two lines are affected by their relative switching characteristics.

For example, when the signal on a transmission line is synchronously switching with the signal from a nearby transmission line, and its signal polarity is opposite of the signal polarity from the nearby transmission line, this situation is referred to herein as odd-mode signal propagation.

The third qubit 250 in FIG. 2 is driven through its control line 210. The third qubit has a corresponding control line 210 that is on a second plane (e.g., interposer chip). It will be understood that the control line 210 and its corresponding qubit 250 need not literally be on a same circuit level. For example, the control line 210 may be at a different metallization level that is one or more layers higher (or lower) than that of the qubit. Accordingly, the term "plane" is used herein to describe one or more groups of layers, such as those of quantum chips. The two circuit planes can be on separate chips in a flip chip geometry, where the second circuit plane on a second chip is bonded to the first quantum circuit plane on a first chip via bump bonds. In another example, the two circuit planes can be located on the same chip, for example, on opposite surfaces of the same chip, be buried, or on a surface circuit plane, where the first and the second circuit planes are connected by through-silicon vias or regular vias, respectively.

The coupled-line bus 220 between the first and second qubits 240, 242 of the first circuit plane, and the control line 210 of the third qubit 250 intersect at the crossing point 230, represented by a relatively large circle. As in FIG. 1, the smaller circles (e.g., 250) represent bump bonds that may be used in flip-chip architectures.

In FIG. 2, qubits 240 and 242 are coupled to the coupled-line bus 220 in a differential way such that they will excite only the odd mode of the coupled-line bus, whereas the control line 210 will excite only the even mode of the coupled bus line 220. Thus, there will be no signal leaked from the control line 210 to the first and second qubits 240, 242 of the first plane and the classical crosstalk significantly suppressed.

Figure 3:
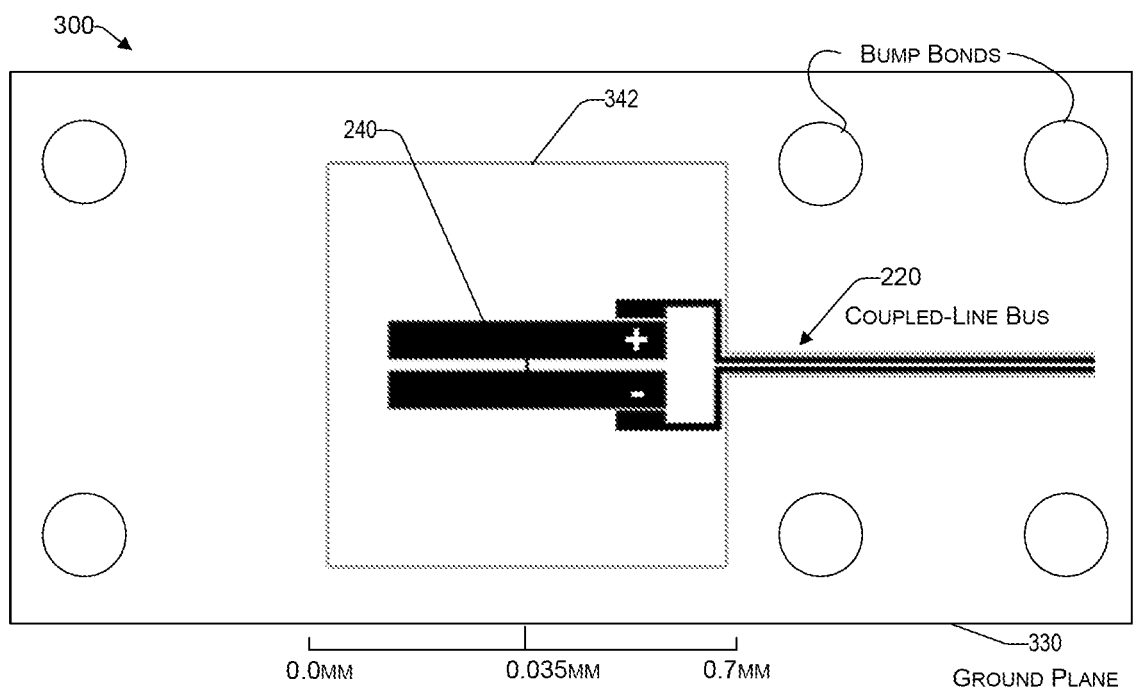
FIG. 3 provides a close-up view of the first qubit of FIG. 2, consistent with an illustrative embodiment.

Reference now is made to FIG. 3, which provides a close-up view 300 of the first qubit of FIG. 2, consistent with an illustrative embodiment. The first qubit 240 and the second qubit (not shown in FIG. 3) are coupled differentially by the coupled-line bus 220. Each qubit may be in each corresponding silicon substrate (e.g., 342 for first qubit 240). By way of example only and not by way of limitation, the structure of FIG. 3 is illustrated to be on top of a ground plane 330. As explained above, by virtue of using a coupled-line bus 220 the first and second qubits 240, 242 excite only the odd-mode of the coupled bus line 220. The +/− symbols in FIG. 3 are used to illustrate the differential excitation of the odd-mode of the coupled-line bus 220.

Figure 4:
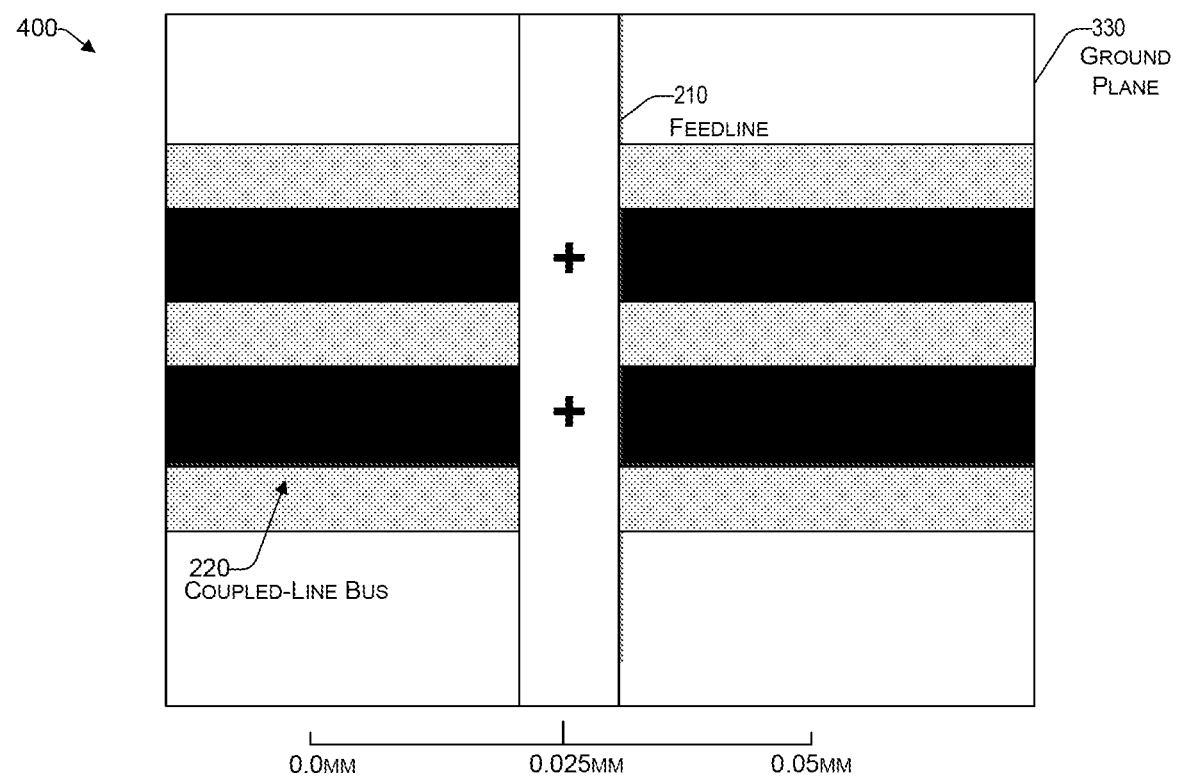
FIG. 4 provides a close-up view of the crossing point region of FIG. 2, consistent with an illustrative embodiment.

FIG. 4 provides a close-up view 400 of the crossing point region of FIG. 2, consistent with an illustrative embodiment. In the example of FIG. 4, the control line 210 crosses the coupled-line bus 220 orthogonally, thereby suppressing the inductive coupling. A finite capacitive coupling may remain. However, applicants have determined that qubits are insensitive to this capacitive crosstalk since the control line 210 only excites the even-mode of the coupled-line bus 220. In one embodiment, the voltage on the control line 210 is assumed to stay constant across the crossing region, which provides a good approximation, given the wavelength of the excitation of a qubit (e.g., first qubit 240, second qubit 242, and/or third qubit 250) being much longer than the width of the coupled-line bus 220 slot (i.e., the gap between the lines of the coupled-line bus).

Using a dual strip CPW coupled-line bus (on the first quantum circuit plane) to couple the qubits, suppresses the capacitive crosstalk from the control line (on the interposer chip related to the control line 210) by several orders of magnitude compared to using a single-line CPW transmission-line resonator of FIG. 1. In one aspect, the suppression ratio may mainly depend on a gap between the lines of the coupled-line bus 220. Accordingly, the smaller the gap, the better the suppression ratio. However, smaller gap sizes reduce the internal quality factor. The internal quality factor at the single photon limit is determined by the coupling to TLS's (two-level systems) at the interfaces. The coupling happens by electric dipole coupling. Smaller gaps produce larger electric fields, hence, lower quality factors. Accordingly, there is a sweet spot where the internal quality factor is favorable and the crosstalk suppression is sufficient. In this regard, the coupled-line bus 220 has a gap that is based on the minimum pitch possible for that particular circuit design. With dimensions used in current practice the classical crosstalk can be reduced, for example, by up to two orders of magnitude compared to using a single-line bus having similar dimensions.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A system, comprising:
   a first quantum circuit plane comprising:
      a first qubit;
      a second qubit;
      a third qubit; and
      a coupled-line bus coupled between the first qubit and the second qubit; and
   a second circuit plane connected to the first quantum circuit plane, comprising a control line coupled to the third qubit, wherein the control line and the coupled-line bus are on different planes and cross over each other and are configured to mitigate cross-talk caused by the crossing over of the control line and the coupled-line during signal transmission.

2. The system of claim 1, wherein the coupled-line bus is configured to transmit differential mode signals between the first and second qubits of the first quantum circuit plane.

3. The system of claim 1, wherein the first quantum circuit plane and the second circuit plane are located on separate chips of a flip chip and connected together via bump bonds.

4. The system of claim 1, wherein the control line is a feed line that is configured to transmit a signal to drive the third qubit.

5. The system of claim 1, wherein the control line is a readout resonator that is configured to read a signal from the third qubit.

6. The system of claim 1, wherein the control line is orthogonal to the coupled-line bus at the crossing over of the control line and the coupled-line bus to suppress an inductive coupling between the control line and the coupled-line bus.

7. The system of claim 1, wherein the coupled-line bus is a dual strip coplanar waveguide (CPW) transmission-line resonator.

8. The system of claim 1, wherein the first qubit and the second qubit are coupled to the coupled-line bus differentially and configured to excite only an odd mode of the coupled-line bus.

9. The system of claim 8, wherein a cross talk from the control line to the coupled-line bus is configured to generate a common mode signal on the coupled-line bus that is electrically mitigated.

10. The system of claim 1, wherein a suppression ratio of a crosstalk between the coupled-line bus and the control line depends on a gap between lines of the coupled-line bus.

11. A method of reducing crosstalk between different planes of qubits, the method comprising:
   providing a coupled-line bus between a first qubit and a second qubit of a first quantum circuit plane;
   providing a control line to a third qubit of the first quantum circuit plane, wherein the control line is on a second circuit plane that is on a different plane than the first quantum circuit plane; and
   coupling the first quantum circuit plane to the second circuit plane such that the control line and the coupled-line bus are on different planes and cross over each other, wherein the control line and the coupled-line bus mitigate cross talk caused by the crossing over of the control line and the coupled-line bus during signal transmission.

12. The method of claim 11, further comprising transmitting differential mode signals between the first and second qubits of the first quantum circuit plane.

13. The method of claim 11, wherein the first quantum circuit plane and the second circuit plane are located on separate chips and connected together via bump bonds.

14. The method of claim 11, further comprising driving the third qubit through the control line.

15. The method of claim 11, further comprising suppressing an inductive coupling between the control line and the coupled-line bus by arranging the control line to be orthogonal to the coupled-line bus.

16. The method of claim 11, further comprising coupling the first qubit and the second qubit to the coupled-line bus differentially to excite only an odd mode of the coupled-line bus.

17. A quantum circuit structure, comprising:
a coupled-line bus between a first qubit and a second qubit of a first quantum chip; and
a control line to a third qubit, wherein:
the control line that is on a second chip is on a different plane than the first quantum chip,
the second chip is bonded to the first quantum chip via bump bonds, and
the control line and the coupled-line bus are on different planes and cross over each other and configured to mitigate cross talk caused by the crossing over of the control line and the coupled-line bus during signal transmission.

18. The quantum circuit structure of claim 17, wherein the coupled-line bus is configured to transmit differential mode signals between the first and second qubits of the first quantum chip.

19. The quantum circuit structure of claim 17, wherein the control line is orthogonal to the coupled-line bus at the crossing to suppress an inductive coupling between the control line and the coupled-line bus.

20. The quantum circuit structure of claim 17, wherein the first qubit and the second qubit are coupled to the coupled-line bus differentially and configured to excite only an odd mode of the coupled-line bus.

21. The quantum circuit structure of claim 17, wherein a suppression ratio of a crosstalk between the coupled-line bus and the control line depends on a gap between lines of the coupled-line bus.

22. The quantum circuit structure of claim 17, wherein the first qubit and the second qubit comprise additional coupling buses in addition to the coupled-line bus.

* * * * *